US007332037B2

(12) United States Patent
Abergel et al.

(10) Patent No.: US 7,332,037 B2
(45) Date of Patent: Feb. 19, 2008

(54) NUMERICAL JET MACHINE FOR THE APPLICATION OF A COATING ONTO A SUBSTRATE

(75) Inventors: Edmond Abergel, Paris (FR); Raphael Renaud, Ivry sur Seine (FR)

(73) Assignee: MGI France, Ivry sur Seine (FR)

( * ) Notice: Subject to any disclaimer, the term of this patent is extended or adjusted under 35 U.S.C. 154(b) by 0 days.

(21) Appl. No.: 11/423,761

(22) Filed: Jun. 13, 2006

(65) Prior Publication Data

US 2007/0064030 A1 Mar. 22, 2007

(30) Foreign Application Priority Data

Jun. 14, 2005 (FR) .................................. 05 05981

(51) Int. Cl.

| | |
|---|---|
| ***B05C 11/00*** | (2006.01) |
| ***G06F 19/00*** | (2006.01) |
| ***B41J 3/00*** | (2006.01) |
| ***B41J 29/38*** | (2006.01) |
| ***B41J 2/15*** | (2006.01) |
| ***B41J 2/145*** | (2006.01) |
| ***B41J 2/14*** | (2006.01) |
| ***B41J 2/16*** | (2006.01) |
| ***B41J 2/045*** | (2006.01) |
| ***B41J 2/07*** | (2006.01) |
| ***B41J 2/17*** | (2006.01) |
| ***H01L 21/44*** | (2006.01) |

(52) U.S. Cl. ....................... 118/685; 118/686; 118/692; 118/695; 700/119; 700/121; 700/123; 347/4; 347/9; 347/12; 347/40; 347/47; 347/68; 347/74; 347/84; 438/674

(58) Field of Classification Search ................ 700/117, 700/118, 121–123, 119; 118/668, 676, 679–681, 118/683, 684, 688, 692, 695, 685, 686; 427/207.1, 427/208.2, 208.4, 208.8, 372.2; 347/4–9, 347/12, 16, 17, 20, 40, 44, 47, 54, 56, 60, 347/68, 73, 74, 84, 85, 95, 100, 105; 29/890.1; 438/674; 310/311

See application file for complete search history.

(56) References Cited

U.S. PATENT DOCUMENTS 3,466,659 A 9/1969 Ascoli (Continued)

FOREIGN PATENT DOCUMENTS

EP 523589 A1 * 1/1993

(Continued)

*Primary Examiner*—Crystal J. Barnes
(74) *Attorney, Agent, or Firm*—Lowe Hauptman Ham & Berner LLP

(57) ABSTRACT

The invention concerns a contactless numerical printing machine for products of average fluidity, such as varnish, glue, and conducting or scratchable ink, onto a substrate of variable thickness and dimensions. The machine includes a special device for printing without contact by projection. The projected materials are materials of average fluidity or composed of large-dimension molecules. The process used includes an electro-acoustic device for control of the projection, and a multiplicity of projection nozzles, each controlled individually.

The machine also includes a production chain with different work stations, whose printing devices are controlled by a computer management system. The production chain allows printing with a certain precision in given zones located during the processing by an appropriate work station.

13 Claims, 2 Drawing Sheets

U.S. PATENT DOCUMENTS

| | | | | |
|---|---|---|---|---|
| 3,950,760 | A | 4/1976 | Rauch et al. | |
| 4,743,469 | A * | 5/1988 | Lehmann | 427/208.2 |
| 5,308,398 | A * | 5/1994 | Ottl et al. | 118/674 |
| RE35,737 | E * | 2/1998 | Sourlis et al. | 347/47 |
| 5,880,747 | A * | 3/1999 | Bartenwerfer et al. | 347/4 |
| 6,057,628 | A * | 5/2000 | Viljoen et al. | 310/311 |
| 6,503,831 | B2 * | 1/2003 | Speakman | 438/674 |
| 6,735,050 | B2 * | 5/2004 | Takagi et al. | 360/244.9 |
| 6,986,739 | B2 * | 1/2006 | Warren et al. | 600/159 |
| 7,168,167 | B2 * | 1/2007 | Silverbrook | 29/890.1 |
| 2005/0255249 | A1 * | 11/2005 | Schlatterbeck et al. | 427/372.2 |
| 2006/0001726 | A1 * | 1/2006 | Kodas et al. | 347/105 |
| 2007/0056598 | A1 * | 3/2007 | Bray et al. | 131/284 |

FOREIGN PATENT DOCUMENTS

| | | |
|---|---|---|
| EP | 1 063 096 | 12/2000 |
| EP | 1 442 892 | 8/2004 |

* cited by examiner

NUMERICAL JET MACHINE FOR THE APPLICATION OF A COATING ONTO A SUBSTRATE

RELATED APPLICATIONS

The present application is based on, and claims priority from, FR Application Number 0505981, filed Jun. 14, 2005, the disclosure of which is hereby incorporated by reference herein in its entirety.

BRIEF SUMMARY OF THE INVENTION

The invention concerns the area of printing without physical contact onto a substrate of which at least one face is in plastic, and more particularly a machine, independent from a printing system, which allows, before or after the printing system, the application by jet of a product having a viscosity going up to 1000 centipoises, and described as average to large, such as varnish, glue, conducting or scratchable ink, onto a substrate of variable thickness and dimensions.

There already exist jet printing systems operating with inks whose viscosity is low and of the order of ten or so centipoises.

The existing systems use different techniques to project a bubble of ink onto the medium. According to a first technique, the ink contained in a nozzle is expelled by a pressure created by a gaseous bubble formed at a heating resistance which creates a chemical reaction by converting the ink to the gaseous state. Another technique to create pressure is to use a piezo-electric component which curves inward under the effect of an electric voltage, so as to reduce the volume of the ink reservoir. A droplet of ink is thus expelled from the nozzle.

These systems are however limited to inks or products with a controlled fluidity and a low viscosity as well as molecules of very small dimension. For example, it is not possible with the existing appliances to apply, without contact with the medium, products such as varnish, scratchable ink, conducting ink or glue, in particular onto a plastic substrate or the plastic face of a substrate.

Up to the present, the application of such products onto substrates, possibly plastic or of which one face is plastic coated, has been done by spreading and not by projection, which renders complex the application to only a portion of surface of the substrate.

In addition, there is a real need, in particular for customisation purposes or to render documents hard to falsify, to be able to apply a layer of product easily onto a substrate, possibly with a plastic face, in a given zone, before or after printing of the substrate.

BACKGROUND OF THE INVENTION

The present invention therefore has as its objective to overcome one or more of the drawbacks of previous designs by creating a machine that can be used to apply, without contact, onto a portion of a substrate, products or inks of average fluidity, such as varnish, glue, conducting or scratchable ink, onto a substrate of variable thickness and dimensions.

This objective is attained using a numerical jet machine for a viscous material, for the application of a coating onto a plastic face of a substrate, including an input magazine and an output magazine, a computer device to manage the operations on each of the work stations, a device for moving the substrate between the different work stations, a device for grasping and transferring the substrate from the input magazine to the movement device and from the movement device to the output magazine, wherein it includes at least:

- a read station which reads and determines at least one position of the substrate and/or of markers placed on the substrate,
- an application station composed of at least a series of nozzles arranged in a ramp, each nozzle being piloted separately by a command device, and fed from a reservoir containing product with medium or high viscosity to be projected onto the substrate during a relative movement between the substrate and the application station, to effect the application of the product in a given zone of the substrate, with the nozzles being hollow needles each made to vibrate by a piezoelectric actuator affixed to a resonator formed by the assembly of the hollow needle, with the excitation of the actuator in duration and power determining the dimensions and the shape of the drop of material of medium or high viscosity,
- a drying station with an infra-red or heated air current or UV drying oven, with the control of the command device of the application station according to the position of the substrate, to the read station and to the drying station, and/or with the management of the information received at the different work stations to coordinate the operations, being effected by the management computer device in accordance with an established programming file.

According to another particular feature, the zone of application is specified for each substrate by a configuration file concerning the shape of the zone, its position on the substrate in relation to the substrate markers, the quantity of product to be projected, a machine control program making use of this information in order to translate it into parameters of relative movement of the substrate and of the nozzles, for selective control of the nozzles and of reiteration of offset passage of the substrate in front of the nozzles to produce joined-up lines if necessary.

According to another particular feature, the ramp in which the nozzles are arranged is equipped with a movement device in relation to the medium.

According to another particular feature, the projection site on the substrate is specified by the relative movement of the substrate in relation to the ramp in which the nozzles are arranged.

According to another particular feature, the product is glue and the drying is by heated air current.

According to another particular feature, the product is an aqueous varnish and the drying is by infra-red.

According to another particular feature, the product is a scratchable opaque ink and the drying is by heated air current.

According to another particular feature, the machine includes a device for pressurizing the product to be projected.

Another objective is to propose the use of this machine in a system for the preparation of identification documents (identity card, passport, driving license, etc.) or security documents (access badge, payment card, access key, etc.).

This objective is attained by the combination of a machine according to the invention, used upstream or downstream of an independent printing station or of a station for the installation of an electronic chip on the substrate.

According to another particular feature, the machine according to the invention is used upstream of the printing station for the application of glue in a zone other than that receiving the printing and a second machine is used downstream of the printing station for the application of a varnish on the printed part.

According to a variant, the machine is used upstream of the printing station for the application of varnish in a zone other than the zone receiving the printing and a second machine is used downstream of the printing station for the application of glue in a third zone.

According to a variant, the machine is used upstream of the station for the installation of an electronic chip on the substrate for the application of glue in the zone intended to receive the chip.

BRIEF DESCRIPTION OF THE SEVERAL VIEWS OF THE DRAWING(S)

The invention, its characteristics and its advantages will appear more clearly on reading the description that follows with reference to the figures listed below:

Figure 4:
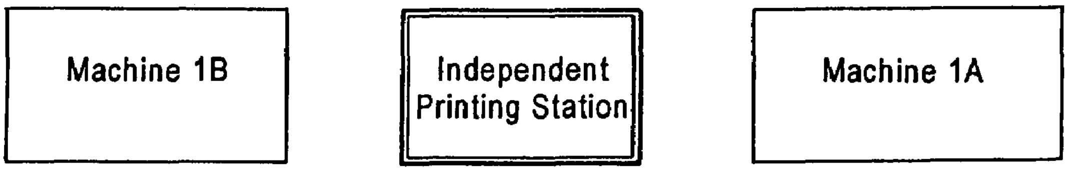

FIG. 4 schematically represents a configuration for the use of two machines according to the invention.

DETAILED DESCRIPTION

Figure 1:
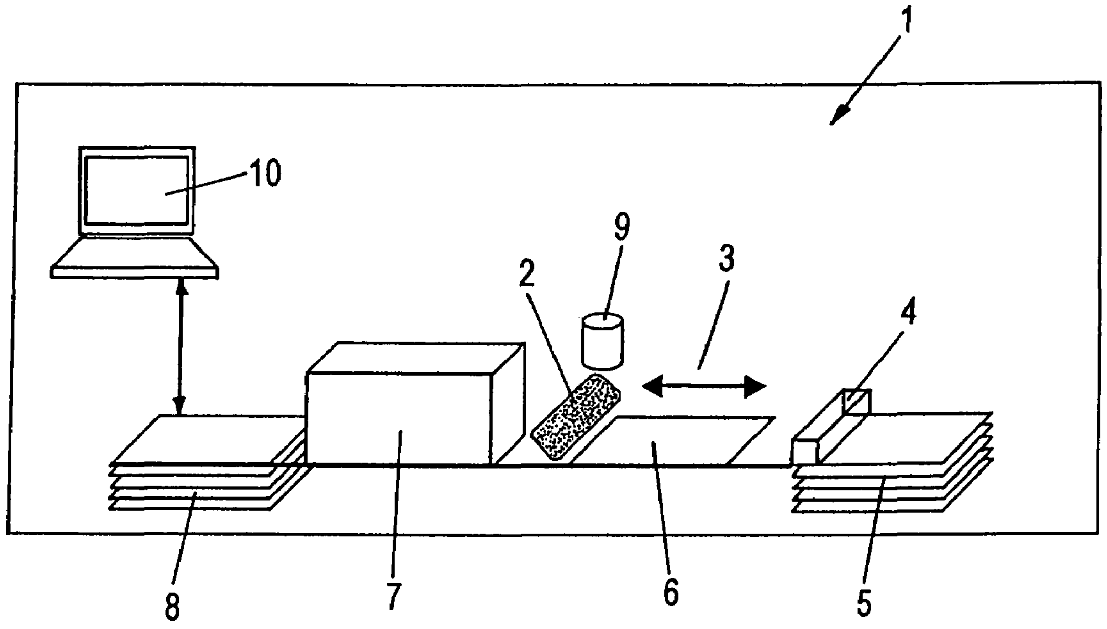
FIG. 1 represents an example of an automated device for printing onto media.

Let us first consider FIG. 1. The machine is controlled by a control computer (10) which controls the different work stations, and also which collects the information from the different sensors. For example, the sensors give information on the positions of the substrates (13), on the configuration data of the substrates (13) or on the validation information following an operation, effected correctly or not. The substrates (13) awaiting printing are placed in an input magazine (5) with a capacity specified according to the nature of the substrate (13) and of the printing needs. In one implementation example, the input magazine (5) is designed to accept several thousand substrates (13) of variable nature, of variable thickness up to 800 μm and of variable dimensions (credit-card format up to format AO) and possibly of which at least one face is in plastic. Once the application process has ended, the substrates (13) are stored in an output magazine (8) with generally the same capacity as the input magazine (5). A device for grasping (4) the substrates (13) is used to extract the substrates (13) from the input magazine (5) and to place them on a conveyor in order to move them along a working chain with several work stations. The first work station of the chain is a margin stop (6) with indexing of the substrate (13) which allows positioning in relation to two reference edges or the detection of a printed marker on the substrate (13). A sensor detects the position information and sends it to the computer by a cable or wireless network. This information, stored in memory in the computer, will then be reused by other work stations controlled by the computer. Checks are also performed in order to detect the presence of a substrate (13) unique to each station on the conveyor.

Figure 2:
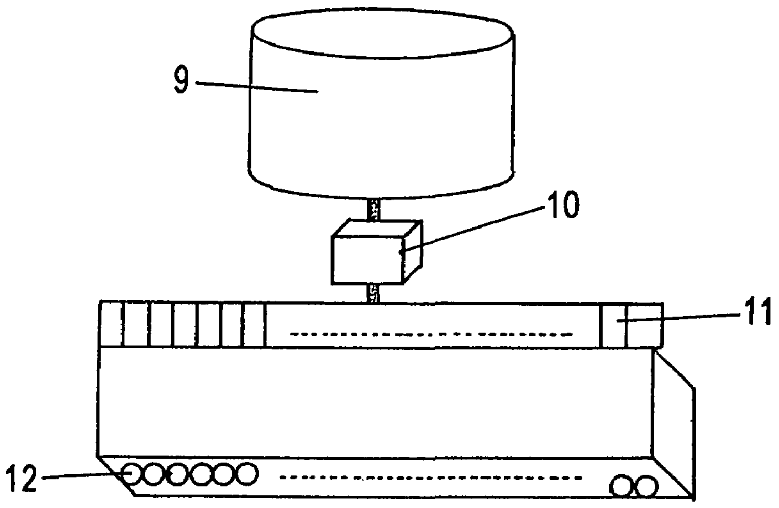
FIG. 2 represents an example of a projection device.

The next work station is the projection device (2, 9) for application of the product to the medium. The contactless projection device (2, 9) is detailed in FIG. 2. The projection device includes a reservoir (9) which contains the viscous product to be projected. Non limiting examples of products contained in the reservoir are varnish, scratchable ink, conducting ink or glue whose average viscosity is between 100 and 1000 centipoises, that is much higher than the viscosity of printing inks, which are normally ten or so centipoises. The feeding of the reservoir not shown is effected, for example, manually or automatically by a feed circuit or indeed of semi-automatically by device controlled by an operator. The reservoir (9) is connected to a pressurising device (10). In fact, the projection system requires a given pressure for correct operation. The pressurising device therefore includes means to control and regulate the pressure of the product sent to the nozzles, and in a non limiting manner controlled by the computer. The nozzles fed directly by the pressurising device (10) are all controlled individually by a nozzle control device (11), in a non-limiting manner controlled by the computer. The nozzles are aligned and assembled on a ramp, thus forming a ramp of nozzles (12). Each nozzle is composed of the end of a hollow needle which is made to vibrate by a piezoelectric actuator affixed to the resonator formed by the assembly of the hollow needle on the ramp. The control of each nozzle is an electro-acoustical process, meaning that the product is projected by a vibration controlled by electric excitation. The nozzles spaced by 0.1 to 0.5 mm thus allow to cover a precise surface.

The application zone is specified for each substrate by a configuration file contained in a memory zone of the computer, concerning the shape of the zone, its position on the substrate in relation to the substrate markers, the quantity of product to be projected, a machine control program making use of this information in order to translate it into parameters of relative movement of the substrate and of the nozzles, selective control of the nozzles and reiteration of the offset passage of the substrate in front of the nozzles to produce joined-up lines if necessary.

The next station of the projection machine is the drying oven (7). The oven (7) is used to fully or partly dry the projected product. The drying, according to the applied product, can be performed by an infra-red radiation in the case of an aqueous varnish or by a heated air-current for glue or an scratchable ink or by UV, according to the projected product. The drying then allows the substrate (13) to be stored in the output magazine (8), so that the projected product is not transferred onto other substrates (13) or onto the magazine (8) with which the substrate (13) is in contact.

Figure 3:
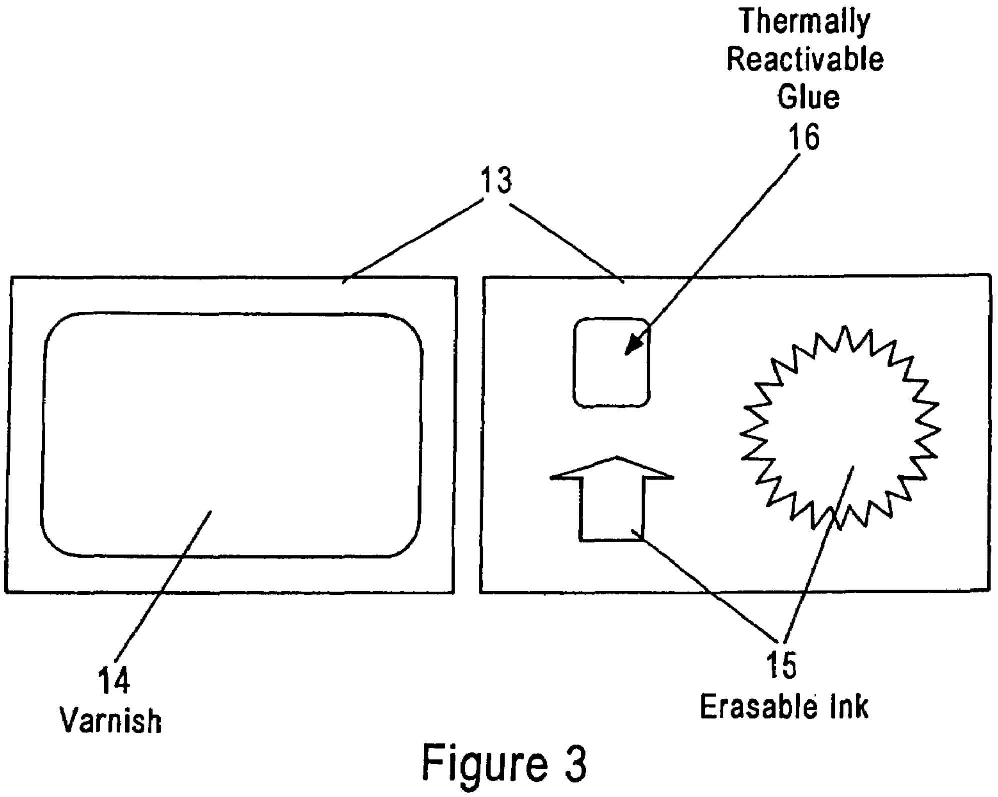
FIG. 3 represents examples of projection patterns on media.

FIG. 3 gives non-limiting examples of applications effected by projection onto substrates (13). Thus the application of a layer of varnish (14) is effected onto a face either before or after printing. For example, a layer of varnish occupies a zone on the substrate that is more or less rectangular, and whose corners are rounded. In a non-limiting manner, a margin not covered with projected product is left on the periphery of the face of the substrate. On a zone (16, FIG. 3) of a substrate, a layer of thermally reactivable glue is placed in a pattern, such as a small rectangle rounded at the corners. For example different patterns of scratchable ink (15) are applied to other zones, such as an arrow or a star for example, or any other pattern with, in a non-limiting manner, an outline formed of angles and straight or curved lines.

With reference to FIG. 4, by the use of two machines, one (1A) before the printing, the other (1B) after printing, and loading the reservoirs of these machines with the appropriate viscous products, different printings are effected, in a non-limiting manner, on two faces of a substrate. These printings can be zones that are printed and protected by a varnish for example, zones printed and covered with an scratchable ink or zones coated with glue or indeed a combination of these different options on any face. Printing on the different faces is effected by a turning mechanism (not shown) between one machine and the next or previous machine.

Electro-acoustic control is used to adjust the projection of material in terms of duration and power. The application zones are then determined by this numerical process with a precision of the order of 0.1 mm. The machine can therefore apply a point or indeed can cover the whole surface of a substrate. The application zone is specified for each substrate by a configuration file concerning the shape of the zone, its position on the substrate in relation to the substrate markers, the quantity of product to be projected. A machine control program uses this information in order to translate it into parameters of relative movement of the substrate and of the nozzles, parameters for selective control of the nozzles and parameters for reiteration of the offset passage of the substrate in front of the nozzles to produce joined-up lines if necessary.

In another embodiment example, the working chain includes other additional work stations allowing, for example, the assembly of different parts together, in the case of application of glue to the specified contact zones it should be obvious to people well-versed in this area that this present invention allows methods of implementation in many other specific forms without moving outside the range of application of the invention as claimed. As a consequence, the present methods of realisation should be seen as illustrations only, and can be modified within the area specified by the scope of the attached claims, and the invention should not be limited to the details given above.

The invention claimed is:

1. A numerical jet machine for viscous material for the application of a coating to a plastic face of a substrate, including:

a reservoir including a viscous product having viscosity between 100 and 1000 centipoises, an input magazine and an output magazine, work stations and a computer device to manage the operations on each of the work stations, a movement device for moving the substrate between the different work stations, a device for grasping and transferring the substrate from the input magazine to the movement device and from the movement device to the output magazine, further comprising at least:

a read station for reading and determining at least one position of the substrate and/or of markers placed on the substrate, a application station including a series of plural nozzles arranged in a ramp, each of the nozzles including a hollow needle, a piezoelectric actuator affixed to a resonator formed by an assembly included in each hollow needle, a drying station with an infra-red or heated air current of UV drying oven;

wherein each hollow needle is piloted separately by a command device, and is arranged to be fed from reservoir including said viscous product to be applied onto the substrate during relative movement between the substrate and the application station, to apply the product in a given zone on the substrate, wherein each hollow needle is arranged to be vibrated by its associated piezoelectric actuator, with the excitation of the actuator, in duration and power, determining the dimensions and the shape of the drop of viscous product, wherein of the management computer device is arranged to be responsive to an established programming file for controlling the command device of the application station according to the position of the substrate, to the read station and to the drying station with the management of the information received at the different work stations to coordinate the operations.

2. A machine according to claim 1, wherein the application zone is specified for each substrate by a configuration file concerning the shape of the zone, the position of the zone on the substrate in relation to the substrate markers, the quantity of product to be applied, with a machine control program arranged to use this information for translating the information into parameters of relative movement of the substrate and of the nozzles, for selective control of the nozzles and for reiteration of the offset passage of the substrate in front of the nozzles to produce joined-up lines if necessary.

3. A machine according to claim 1, wherein the ramp in which the nozzles are arranged is equipped with a movement resource in relation to the medium.

4. A machine according to one of claim 1, wherein the application site on the substrate is specified by the relative movement of the substrate in relation to the ramp on which the nozzles are arranged.

5. A machine according to one of claim 1, wherein the product is glue and the drying station includes a heated air current source.

6. The machine according to claim 5 in combination with an independent printing station or of a station for installing an electronic chip on the substrate, wherein the machine is disposed upstream or downstream of the independent printing station or of a station for installing an electronic chip on the substrate.

7. The combination according to claim 6, wherein the first machine is disposed upstream of the printing station, for applying glue in a zone other than the zone receiving the printing, and the second machine is disposed downstream of the printing station for applying varnish on the printed part.

8. The combination according to claim 6, wherein the second machine is disposed upstream of the printing station for applying varnish in a zone other than the zone receiving the printing, and the first machine is disposed downstream of the printing station for applying glue in a third zone.

9. The combination according to claim 6, wherein the first machine is disposed upstream of the station for the installation of an electronic chip on the substrate applying glue in the zone intended to receive the chip.

10. A machine according to one of claim 1, wherein the product is an aqueous varnish and the drying station includes an infra-red source.

11. The machine according to claim 10 in combination with an independent printing station or of a station for installing an electronic chip on the substrate, wherein the machine is disposed upstream or downstream of the independent printing station or of a station for installing an electronic chip on the substrate.

12. A machine according to one of claim 1, wherein the product is a scratchable opaque ink and the drying station includes a heated air current source.

13. A machine according to one of claim 1, further comprising a device for pressuring the product to be applied.

* * * * *